United States Patent [19]

Hed

[11] Patent Number: 5,010,311

[45] Date of Patent: Apr. 23, 1991

[54] ELECTRONIC MODULATION OF MAGNETIC FIELDS

[75] Inventor: Aharon Z. Hed, Nashua, N.H.

[73] Assignee: International Superconductor Corp., Riverdale, N.Y.

[21] Appl. No.: 314,426

[22] Filed: Feb. 22, 1989

[51] Int. Cl.⁵ .............................................. H01F 7/22
[52] U.S. Cl. .................................... 335/216; 338/32 S
[58] Field of Search .............. 338/32 S; 335/216, 299; 174/125.1; 505/1

[56] References Cited

U.S. PATENT DOCUMENTS

| | | | |
|---|---|---|---|
| 4,528,532 | 7/1985 | Keim | 335/216 |
| 4,586,017 | 4/1986 | Laskaris et al. | 338/32 S |
| 4,635,015 | 1/1987 | Franksen | 335/216 |
| 4,722,134 | 2/1988 | Wilson | 335/216 X |
| 4,803,456 | 2/1989 | Benesch | 338/32 S |
| 4,868,707 | 9/1989 | Takechi | 335/216 X |
| 4,870,379 | 9/1989 | Aihara et al. | 335/216 X |

FOREIGN PATENT DOCUMENTS

| | | | |
|---|---|---|---|
| 0306287 | 3/1989 | Japan | 335/216 |
| 0160065 | 6/1989 | Japan | 335/216 |

OTHER PUBLICATIONS

European Patent Application, 0,292,436, Nov. 23, 1988, Davidson et al., IBM.

*Primary Examiner*—George Harris
*Attorney, Agent, or Firm*—Herbert Dubno

[57] ABSTRACT

Novel methods of electronically modulating magnetic fields are described. The basic principle of the instant invention is based on the well known Meissner Effect. A superconducting element is placed within a magnetic field whose strength is much less than the critical field of the superconductor. The field flux is excluded out of the superconducting medium. When the superconductor is now forced into its mixed or normal phase by external means, the magnetic field around it is modified and thus modulation of that field near the superconductor surface is possible. Three distinct methods of modulating magnetic fields on the surfaces of superconductors are detailed and some applications disclosed.

18 Claims, 1 Drawing Sheet

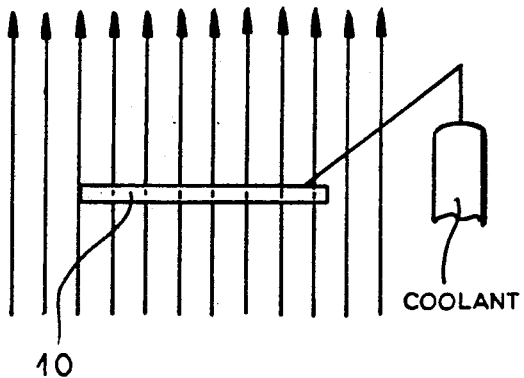
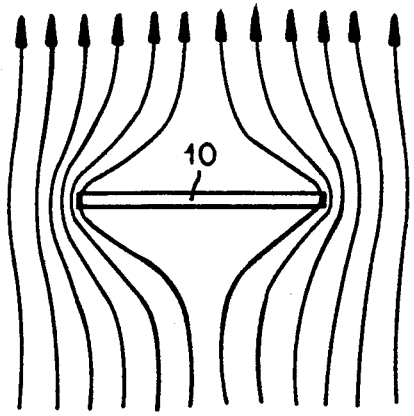
FIG.1A
FIG.1B
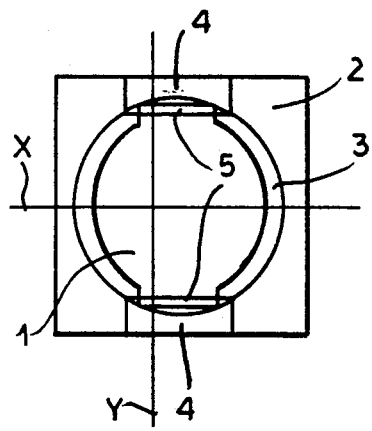
FIG.2A
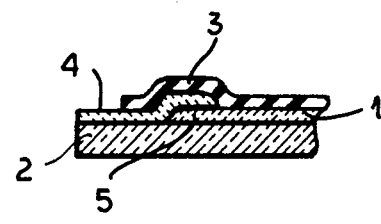
FIG.2C
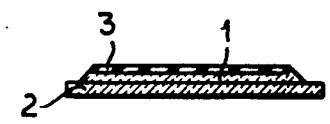
FIG.2B
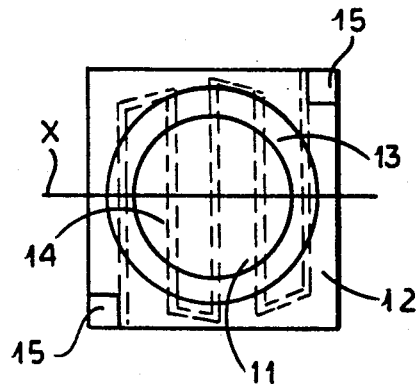
FIG.3A
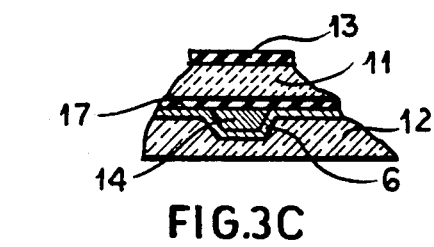
FIG.3C
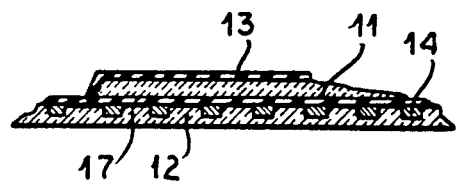
FIG.3B

ELECTRONIC MODULATION OF MAGNETIC FIELDS

BACKGROUND OF THE INVENTION

Magnetic fields are generally the result of either an electrical current flowing in a wire or emanate from a permanently or intermittently (an electromagnet) magnetized magnet. In both cases the morphology of the field is fixed, and only in fields that are generated by a current including electromagnets) can the intensity of the field be modulated.

If it is necessary to modulate a magnetic field, including its topology, one can revert in the current art to the mechanical rearrangement of existing field bearing devices, a cumbersome and limiting technique. Thus the concept of electronically modulating magnetic fields and their topology has remained foreign to the prior art.

The subject of the instant invention are devices that facilitate morphological and intensity modulation of magnetic fields by essentially electronic means.

I have found that it is possible to regulate magnetic fields without resorting to mechanical manipulation of fixed magnetic field forming devices by using superconducting elements that can be driven in and out of their superconducting phases either completely or partially (namely driven into the mixed state).

I have further developed a variety of devices in which the heart of the device is a superconducting element that can be switched in and out of the superconducting phase, with the result that a fixed magnetic field in which the said superconducting element is placed, is modulated at will, at least in the immediate vicinity of said element, by the modulation of the superconducting element magnetization.

I have also established that, as a rule, the use of a flat superconducting element is preferred, and that certain applications require the modulation of magnetic fields on such flat surfaces.

OBJECTS OF THE INVENTION

It is an object of the present invention to provide a method of and an apparatus for electronically modulating external magnetic fields through the use of a selected superconductor and switching said superconductor into their mixed or normal states.

Another object is to provide improved systems and devices whereby said modulation of external magnetic fields can be accomplished.

Still another object is to introduce a new and novel usage of high temperature ceramic superconducting materials.

A final object is to delineate methods wherein said devices find use and to achieve the advantages of being able to modulate an given magnetic field.

SUMMARY OF THE INVENTION

The essence of the invention is the application of superconducting elements that are switched in and out of the superconducting state and/or the mixed state, to modulate an existing magnetic field in their vicinity controllably.

Superconducting elements are formed either as flat self-supporting panels or elements, or as thin layers on suitable substrates. In either case, a resistive heating element may also be formed by methods of the prior art. Alternatively or sometimes on the same device, electrical leads are attached to the said superconductive element. Operation is carried out at temperatures that are below the superconducting substance critical temperature and modulation of a magnetic field in the vicinity of said superconducting elements is achieved by changing thermally and/or electrically the magnetization of the superconductor from said superconducting state to its normal state or mixed state so as to modulate said magnetic field. The magnetic field direction may be positioned either horizontally or vertically, but in any event is perpendicular to the face of the superconducting element.

It is well known that a superconducting compound will exclude an external magnetic field from within its bulk (the Meissner Effect). Despite the fact that this phenomenon has been known for quite some time, not many devices using this effect and further the ability to switch a superconductor from the superconductive state to a mixed state or even to its normal state have been developed. This is probably due to the fact that until recently, superconductivity could be obtained only at temperatures under 23 K. The recent discovery of high temperature superconductors, and particularly the fact that a broad range of magnetic fields exist where these materials are in the mixed state, have led me to the development of devices utilizing the Meissner effect and particularly the dependence of the extent of the Meissner effect on temperature, magnetic field and current density.

The preferred embodiment of my new invention makes use of this effect by a novel design in which the superconductor is maintained at a given temperature below the critical temperature of said superconductor, and in a field below the critical field (for said temperature).

Switching between the normal and superconducting state then modulates any superimposed magnetic field in the vicinity of the superconductor; similarly changing the magnetization of the superconductor between different mixed states will modulate the field in the immediate vicinity of the superconductor. In order to effect maximal modulation of the magnetic field, namely the largest possible difference between the minimum and maximum of the magnetic field in the vicinity of the superconductor, complete switching, to normal phase is effected. This effect can be achieved by two means and combinations thereof, specifically:

A. Current switching, by passing a current through the superconducting film which exceeds the critical current (Ic) of the superconductor.

B. Thermal switching, by raising the temperature of the superconducting element above the critical temperature of the superconductor (Tc).

It should be obvious to those trained in the art that any combination of the above two methods can serve as the switching mechanism between the superconducting and normal states. I have found that the choice of the switching mode and the appropriate combination of switching modes depends on the specific application. For high speed applications, I prefer to use critical current switching. But for low speed applications, thermal switching may be more appropriate.

When only partial modulation of the magnetic field is required, current densities or temperatures or both that are under the critical quantities are used, but in such a way that the applied magnetic field is above Hcl(J,T), the magnetic field for a given pair of current (J) and temperature (T) for which the mixed state is achieved.

In order to make the best use of my new invention, I have designed two main, groups of devices. These are:
A. Self-supporting superconducting elements
B. Superconducting elements on substrates I have further determined that the use of switchable superconducting elements for modulating magnetic fields produces different results when the field direction is coplanar with the surface of the superconducting element than when the magnetic field being modulated is perpendicular to the superconducting element surface.

BRIEF DESCRIPTION OF THE DRAWING

The above and other objects, features and advantages of the present invention will become more readily apparent from the following description, reference being made to the accompanying drawing in which:

FIG. 1A and 1B are diagrams illustrating the effect of modulation of the magnetic field by a flat superconductor perpendicular to the magnetic field;

FIG. 2A is a plan view of the modulating superconductor according to a first embodiment of the invention;

FIG. 2B is a sectional view thereof along the line X of FIG. 2A;

FIG. 2C is a sectional view along the line Y of FIG. 2A drawn to a larger scale than FIG. 2B; and FIG. 3A-3C are views similar to FIG. 2A-2C pertinent to a further embodiment.

SPECIFIC DESCRIPTION

To illustrate the phenomenon of the invention, I have shown in FIG. 1., Part A the undisturbed magnetic field perpendicular to the superconducting element surface. The superconducting element itself is in the normal or switched state. In part B, I show the magnetic field when the superconducting element 10 is in the superconducting state. It is easily seen that, at the surface of the superconducting element, movement from one state to the other does create a change in the magnetic field.

I have also established a number of important points relating to my new invention. The strength of the external magnetic fields that one wishes to modulate should be relatively small. The maximum strength of the magnetic field that can be modulated is a complex function of the properties of the material, the aspect ratio of the superconducting element (maximum dimension perpendicular to the field divided by the thickness of the superconducting element), and the superconducting element's critical temperature, divided by T, the operating temperature of the superconducting element, i.e.-$T_c/T$,.

I have further demonstrated that if the magnetic field becomes too intense, namely above $H_{c1}(T)$, where T is the operational temperature of the superconductor, the unmodulated state (where there is no current or temperature excursion from ambient in the superconducting element) will be a mixed state and the field at the vicinity of the superconductor cannot be decreased below that minimal field. Modulation therefore, will be between that minimal field and the full field, when T and J are raised so as to completely switch the superconductor to its normal state.

While in the following discussion, I will usually refer to the complete switching of the superconductor elements to their normal state, it should be understood that the instant invention applies to partial quenching of the superconductor into the mixed state as well.

In FIGS. 2A-2C I depict an embodiment of the device which uses the critical current switching mode of a superconducting element.

FIG. 2A is a top view of the superconducting element. The superconducting active element 1 is in the form of a circle with two protrusions 5 on which electrical contacts are made. Many other geometries will occur to those skilled in the art. However, these remain within the scope of this invention, because the instant invention depends upon the fact that modulation of an external magnetic field by a selected superconductor depends solely upon a current-being passed through the active element so as to switch said element between its superconducting and normal states. I have also found that if the said superconductor is to be deposited on an appropriate substrate 2 (FIGS. 2B and 2C), the properties of said substrate to be selected will often depend on the intended application. The coating 3 is an insulator that also serves as a barrier to environmental threats to the superconductor. The electrical contacts 4 are exposed at their outer extremities to allow for current contacts, while the area in contact with the superconductor is covered by the insulating layer (#3).

FIG. 2B depicts a cross section of the same device through the perpendicular plane X of FIG. 2A. FIG. 2C is a cross section of the contact area (enlarged relative to FIGS. 2A and 2B) through the perpendicular plane Y of FIG. 2A.

Switching the superconducting element to the normal state is achieved by passing a current in excess of the critical current of the superconductor through the said superconducting medium. In order to minimize the current required to achieve switching, the thickness of the superconducting medium must also be minimized. I have established that it is advisable that the thickness of said superconducting medium be larger than the penetration depth of magnetic fields being used. The contacts themselves can be of an appropriate metal, like copper, silver or gold, to mention some of the best known examples. I have further established that one can also use another more refractory superconductor (with a higher critical current and operating temperature) thus avoiding thermal heating of the assembly from the resistive losses in the contact.

In 3A-3C, I have depicted an embodiment of the thermally switchable superconducting element. FIG. 3A shows a top view of the assembly which has a superconducting medium 11 which is supported by the substrate 12. An insulating coating 13, which also serves as a barrier to environmental threats, is deposited over the active superconducting element. In the substrate there is a resistive heating element 4, that can be made by depositing, as an example, nichrome in an appropriate depression in the substrate which is connected to two contact pads 15.

In FIG. B, I have shown a cross section through a perpendicular plane X, which includes an electrically insulating layer 17. SAid layer has the additional property of being a good thermal conductor, and is selected from: diamond-like carbon, aluminum nitride, or beryllium oxide. This layer is formed between the active superconducting layer and the substrate/heating element surface. In FIG. 3C, which is an enlargement of FIG. 3B showing a single heating element channel, I have depicted the case where one can deposit an optional electrically insulating, but thermally conducting layer (#6) on the channelled substrate. This optional layer is required if the substrate is electrically conducting. Another aspect of the invention is the case where one may want to use a thermally and electrically conductive substrate to avoid charge build up in the system as well as to provide for a heat sink with a longer (or shorter) heat dissipation time. The thermally switchable control method will usually be a slower device with longer switching and recovery time than switchable critical current superconducting elements.

It is not necessary that the external magnetic field be exactly perpendicular to the superconducting element surface. However, I have determined that the extent of modulation, as exemplified by the ratio of the magnetic fields near the surface of the said superconductor oscillating between the two states, is largest with perpendicular fields.

When the field is parallel to the superconductor surface, modulation will occur as well except that the high field is when the superconductor is in the superconducting state, and this field amplification is minimal (about twice as high as the field when the superconductor is quenched into the normal phase) and with little practical utility.

For efficient operation, I have found that one must keep the thickness of the superconducting element to a minimum, but not less than about four times the penetration depth of magnetic fields.

As stated above, I have also determined that one can use such switchable superconducting elements to modulate a magnetic field that is tangential to the surface of the said superconducting element. However, it should be borne in mind that, in this mode of operation, high surface intensities of the magnetic field exist solely when the superconducting element is in its superconducting state, while the low magnetic field state (equal to the applied field) exists when the superconducting element is in its normal state. I have also found that the upper limit of the magnetic field in the superconducting state is a function of the geometry of the superconducting element. Thus for flat and thin superconducting elements where the magnetic field is parallel to the surface, the field intensification due to the full Meissner effect in the superconductor, is about a factor of two over that of the applied field without the impact of the superconducting element. However, for superconducting elements in the mixed state, this number declines toward that of the applied field as the superconducting element approaches its upper critical state, or the extinction of the superconductive phase and the associated Meissner effect.

I have determined that there are certain applications in which the use of my new invention are unique. These include:

1. Field for magnetooptical or magnetostrictive devices.
2. Superconducting elements used as diamagnetic colloid positioning devices in:
   a. Fluidic devices.
   b. Exclusion seals.
   c. Rotary vacuum feedthrough.
   d. Rotary vacuum seals.
   e. Linear seals.
3. Temporally and spatially variable magnetic field imaging using arrays of switchable superconducting element.

EXAMPLES

1. To modulate an incoming beam by a thin magnetooptical device, the device is placed on the surface of a superconducting element as described in FIG. 2. Connection with FIG. 2A with its surface which is near the superconductor coated with a thin reflector (for instance silver). An optical beam reflected from the said reflector is modulated (changed in its character, namely polarization or intensity as the magnetic field on the magnetooptical device is changed. The assembly is in close contact with a liquid nitrogen contact and its temperature is presumably 77° K. Under the modulator a small coil generates a field of about 250 Gauss (or about $2.5 \times 10^{-2}$ Tesla).

The magnetic field modulator is constructed from a strontium titanate substrate on which a superconducting 123 layer about 3000 angstrom thick, 20 mm by 5 mm was deposited by plasma rf sputtering, and then flash annealed for about 20 seconds in pure oxygen at 900° C. Silver contacts are attached to the opposing ends of the superconducting field modulator and the assembly is then coated with about 500 angstrom of diamond like carbon deposited by DC plasma from acetylene based precursor.

The extent of the light beam modulation depends on the current fed to the superconductor. At about 15 milliamperes saturation of the modulation occurs indicating that the critical current density, of the superconductor of the modulator is about 1000 ampere/cm². Short pulses not exceeding about 1 milliseconds are used to avoid deterioration of the modulator due to overheating when in the normal state.

It is understood that the above described embodiments of the invention are illustrative only and modifications and alterations thereof may occur to those skilled in the art. Accordingly, it is desired that this invention not be limited to the embodiments disclosed herein but is to be limited only as defined by the appended claims.

Cross Reference to Disclosure Document

This application is based upon Disclosure Document 195,866 filed 27 June 1988.

I claim:

1. A method of modulating a magnetic field, comprising the steps of:
   (a) establishing a magnetic field to be modulated;
   (b) inserting into said magnetic field a generally flat solid body of a superconductive material having a critical temperature $T_c$ below which the body is superconductive, a critical current density $J_c$ at which said body has a transition between superconductive and nonsuperconductive states and a critical magnetic field $H_c$ which is a function of temperature and current and above which superconductivity of said body is quenched to a mixed state transitting to the nonsuperconductive state said body being positioned to have its major dimensions in a plane perpendicular to said field; and
   (c) controllably periodically or intermittently and reversibly altering the state of said body from one of said states to another of said states, thereby modulating said magnetic field.

2. The method defined in claim 1 wherein the state of the body is altered by changing the temperature of said body.

3. The method defined in claim 1 wherein the state of the body is altered by changing a current passed through said body.

4. The method as defined in claim 1 wherein the state of the body is altered by changing a magnetic field applied to said body.

5. The method defined in claim 1 wherein said body is a layer of a high-temperature oxide ceramic superconductor having a critical temperature above substantially 23° K. on a substrate.

6. A magnetic-field modulator, comprising:
means for generating a magnetic field to be modulated;
a generally flat solid body of a superconductive material inserted into said magnetic field and having a critical temperature $T_c$ below which the body is superconductive, a critical current density $J_c$ at which said body has a transition between superconductive and nonsuperconductive states and a critical magnetic field $H_c$ which is a function of temperature and current and above which superconductivity of said body is quenched to a mixed state transiting to the nonsuperconductive state said body being positioned to have its major dimensions in a plane perpendicular to said field; and
means for controllably periodically or intermittently and reversibly altering the state of said body from one of said states to another of said states, thereby modulating said magnetic field.

7. The magnetic-field modulator defined in claim 6 wherein said body is essentially flat and perpendicular to said field so that extremes of the magnetic field in the vicinity of said body is the field to be modulated when said body is in said nonsuperconductive state and is a fraction of the field to be modulated when said body is in said superconductive state.

8. The magnetic-field modulator defined in claim 6 wherein said body is essentially flat and parallel to said field so that extremes of the magnetic field in the vicinity of said body is the field to be modulated when said body is in said nonsuperconductive state and is between one and two times the field to be modulated when said body is in said superconductive state.

9. The magnetic-field modulator defined in claim 6 wherein said means for controllably altering the state of said body from one of said states to another of said states includes means for passing an electrical current through said body exceeding said critical current density.

10. The magnetic-field modulator defined in claim 6 wherein said means for controllably altering the state of said body from one of said states to another of said states includes means for applying heat to said body to raise the temperature of said body above said critical temperature, said body being normally subjected to cooling to a temperature below said critical temperature.

11. The magnetic-field modulator defined in claim 6 wherein said body comprises a superconductor layer on a substrate formed with a resistance heating element, said means for applying heat to said body including means for electrically energizing said resistance heating element.

12. The magnetic-field modulator defined in claim 6 wherein said means for controllably altering the state of said body from one of said states to another of said states includes means for applying heat to said body to raise the temperature of said body and means for passing an electrical current through said body so that said body undergoes transformation from said superconductive state to said nonsuperconductive state with less heat input than is required to heat said body to said critical temperature and with a smaller current than can provide said critical current density.

13. The magnetic-field modulator defined in claim 6 wherein said means for controllably altering the state of said body from one of said states to another of said states includes means for quenching said superconductive state to said mixed state and so controllable as to obtain magnetic field exclusion in said body from zero to full exclusion.

14. The magnetic-field modulator defined in claim 6 wherein said body is a layer of a high-temperature oxide ceramic superconductor having a critical temperature above substantially 23° K. on a substrate.

15. The magnetic-field modulator defined in claim 6 wherein said body is generally circular and has diametrically opposite protrusions connectable to a controllable source of electric current, said protrusions being formed with nonsuperconductive contacts of high electrical conductivity.

16. The magnetic-field modulator defined in claim 6 wherein said body has at least a superconductive surface coated with an insulating layer forming a diffusion barrier to water vapor and substances capable of affecting chemical stability of the superconductive material.

17. The magnetic-field modulator defined in claim 6 wherein said body is formed with a layer of the superconductive material on a substrate and said substrate has a zig-zag depression filled with nichrome and forming an electrically energizeable resistance heater.

18. The magnetic-field modulator defined in claim 6, further comprising means for cooling said body to a temperature below said critical temperature.

* * * * *